United States Patent [19]

Fritz

[11] Patent Number: 4,635,358

[45] Date of Patent: Jan. 13, 1987

[54] METHOD FOR FORMING ELECTRICALLY CONDUCTIVE PATHS THROUGH A DIELECTRIC LAYER

[75] Inventor: Herbert L. Fritz, Englishtown, N.J.

[73] Assignee: E. I. Du Pont de Nemours and Company, Wilmington, Del.

[21] Appl. No.: 688,332

[22] Filed: Jan. 3, 1985

[51] Int. Cl.$^4$ .............................................. H01K 3/10
[52] U.S. Cl. ...................................... 29/853; 156/644; 174/68.5
[58] Field of Search ................. 29/853, 852; 174/68.5; 156/644

[56] References Cited

U.S. PATENT DOCUMENTS

| | | | |
|---|---|---|---|
| 3,037,265 | 6/1962 | Kollmeier | 29/853 X |
| 3,346,950 | 10/1967 | Schick | 29/853 |
| 3,501,831 | 3/1970 | Gordon | 29/853 |
| 3,557,446 | 1/1971 | Charschan | 29/853 |
| 3,969,815 | 7/1976 | Hacke et al. | 174/68.5 X |
| 3,971,661 | 7/1976 | Lindberg | 156/644 |
| 4,319,708 | 3/1982 | Lomerson | 29/853 X |
| 4,501,638 | 2/1985 | Johnson | 29/853 X |
| 4,517,050 | 5/1985 | Johnson et al. | 29/853 X |

FOREIGN PATENT DOCUMENTS 2347216  3/1975  Fed. Rep. of Germany ........ 29/853

*Primary Examiner*—Howard Goldberg
*Assistant Examiner*—Carl J. Arbes

[57] ABSTRACT

An improved process is disclosed for forming a series of electrically conductive path through-holes in a dielectric layer which is sandwiched between two electrically conductive layers by applying pressure to conductive overhangs in a conductive layer through and elastomeric surface.

9 Claims, No Drawings

METHOD FOR FORMING ELECTRICALLY CONDUCTIVE PATHS THROUGH A DIELECTRIC LAYER

BACKGROUND OF THE INVENTION

The present invention is directed to an improved process for forming conductive through-holes through a dielectric, i.e., an insulating layer, sandwiched between two conductive layers. The process is particularly useful in formation of printed circuit boards.

U.S. Pat. No. 3,969,815 discloses a process for providing an electrical interconnection of two metal layers positioned on opposite sides of a substrate. A hole is initially drilled or bored through the two metal layers and the intermediate insulating layer. The hole in the insulating layer is enlarged by a selective etching process which only etches the insulating layer to form an enlarged annular hole in the insulating layer which undercuts the metal layer portions. Thereafter these overhanging metal portions on opposite sides of the insulating layer are deformed by application of pressure to contact or almost contact one another. The deformed metal portions are coated by galvanic metal which is overcoated by a thin layer, preferably tin, to form a conductive path.

U.S. Pat. No. 4,472,238 discloses forming a conductive through-holes by plasma etching holes completely through a dielectric sandwiched between conductors and by deforming at least one conductor which has been undercut during the etching.

U.S. Pat. No. 3,557,446 discloses a method of forming printed circuit board conductive through-holes using a hydraulic medium such as a rubber pad to extrude, explode or rupture a conductive foil sheet over a hole in a nonconductive substrate in formation of a conductive through-hole in the nonconductive substrate.

U.S. Pat. No. 4,319,708 discloses formation of an electrically conductive path through an insulating plate using dies to distort conductive sheets into holes in the insulating plate.

British Pat. No. 1,010,335 discloses a method of forming embossed edges around holes in a metal plate using elastic material to uniformly distribute pressure.

SUMMARY OF THE INVENTION

The present invention is directed to a process for making multiple electrically conductive paths in a dielectric layer sandwiched between two conductive layers with a series of holes extending through one of the conductive layers and the dielectric layer whereby the holes in the conductive layer and dielective layer are of different size with the conductive layer overhanging the holes in the dielectric layer comprising the step of applying pressure to the conductive overhangs by an elastomeric material which contacts the conductive layer and has a dimpled surface. Improved results have been obtained with use of an elastomeric material with a dimpled surface in the pressure application step compared to an elastomeric material with a smooth surface.

DETAILED DESCRIPTION OF THE INVENTION

The present invention is particularly adapted for forming conductive through-holes, and particularly a great number of precisely located through-holes, through a dielectric layer sandwiched between two electrically conducting materials. Generally the electrically conductive layers are metal, preferably copper, while the dielectric is generally an electrically insulating polymer.

Composites of two layers of an electrical conductive material separated by a dielectric are conventional starting materials for forming circuit boards and are suitable herein. Generally the dielectric layer will be at least one mil in thickness and the conductive layer will be 0.7 to 2.8 mil (0.0178–0.071 cm) thick, e.g., copper foil, although both thinner and thicker layers can be used. The materials of construction of the conductive and dielectric layers are not critical to the present invention provided one conductive layer is deformable, i.e., bendable, by application of pressure.

Hole formation is necessary in one of the conductive layers since the conductive layer is deformed adjacent such hole. The preferred technique of hole formation in the conductive layer involves photolithogrphic techniques and chemical etching which are well-known in the formation of printed circuits. An example of such chemical etching involves laminaation of a negative acting photosensitive film to at least one of the metal layers at the conductor surface which does not face the dielectric layer, exposing the photosensitive polymer to actinic radiation through a photomask, developing and removing unexposed photosensitive polymer to expose portions of the metal layer and thereafter chemically etching completely through the thickness of the exposed conductive layer. This chemical etching step removes little or no material from the dielectric polymer layer. A suitable process is disclosed in Celeste U.S. Pat. No. 3,469,982. Positive working photopolymers and processing techniques well known in the art can likewise be used, e.g., Cohen and Heiart U.S. Pat. No. 4,193,797.

The diameter of the hole photolithogrphically formed in the conductive layer can be small, e.g., in the range of 25 to 250 microns and precisely located relative to features in manufacture of a printed circuit. Also the photolithogrphic process can form a great number of holes simultaneously, e.g., hundreds or thousands of holes can be easily formed in a composite blank for a circuit board of a dimension of 12 inches (30.48 cm) times 12 inches (30.48 cm). Mechanically drilling or punching a hole can also be employed but is less desirable since it is a laborious process with an increasing chance of error or loss in precision as the number of holes increases. Also mechanically drilling or punching of holes smaller than 800 microns results in increased cost due to drill breakage and a hole diameter smaller than 325 microns cannot generally be achieved in production. The hole in the conductive layer need not be circular, e.g., a U-shaped hole having a tab is suitable.

With a number of holes formed in at least one of the conductive layers by photolithographic techniques and chemical etching, a corresponding number of through-holes, or vias, are made in the dielectric layer extending to the other conductive layer. Suitable techniques involve plasma etching disclosed in U.S. Pat. No. 4,472,238 or by chemical etching disclosed in Ser. No. 558,308 filed Dec. 5, 1983. Hole formation can take place in both conductors opposite one another on each side of the dielectric.

For plasma etching and chemical etching the metal conductive layer serves as a mask for the dielectric since the plasma or chemical etchant attacks the dielectric where a hole has been formed. The metal is substantially unaffected by the plasma or, at least, the etching rate of the dielectric is considerably faster than the etching rate of the conductor.

Various types of plasma gases may be used. The etching gas is chosen so as to produce species which react chemically with the material to be etched to form a reaction product which is volatile. Mixtures of various plasma etch gases can also be used. The preferred gas composition to be used where the insulating material or organic material is a polyimide and the mask is copper is carbon tetrafluoroide/oxygen in the ratio of 50/50 to 10/90 (by volume). Suitable chemical etchants include those disclosed in U.S. Pat. No. 3,969,815, e.g., a sulfuric acid solution can be used for polyester and epoxide resins while a caustic alcoholic solution is suitable for a polyimide. Any solvent capable of etching away areas of the polymer not masked by the conductive metal without any deleterious effect on the metal may be used. Examples of solvents are tetrachloroethylene, methyl chloroform, mixture of 90% tetrachloroethylene and 10% isobutyl alcohol (by volume), and chromic acid.

With use of plasma and chemical etchants, it is possible to form holes in the conductive layers opposite one another on different surfaces of the dielectric. In such case hole formation in the dielectric can take place simultaneously from opposite surfaces. Whether a hole formation in the dielectric takes place beginning with one surface or two surfaces, it is critical that that at least one conductive layer overhangs at least a portion of the hole in the dielectic (although overhanging conductive portions on opposite sides of the hole likewise can be formed and used in an alternate embodiment). These overhanging conductive portions are necessary since they are deformed into the dielectric through-hole in making an electrical connection between the two conductive layers.

With use of mechanical drilling or punching, holes are normally made through both conductive layers and the dielectric layer. Enlarging the holes in the dielectric to be of greater size than the holes in the conductor can be by the plasma or chemical etchant techniques already disclosed.

Upon completion of the holes completely through the dielectric, the undercut conductive layer is deformed to contact or come into close contact to the opposite conductive layer. In the embodiment where both conductive layers have holes opposite one another, the conductive overhangs in only one conductive layer need be deformed to contact or come into close contact with the opposite conductive layer. However conductive overhangs in both conductive layers can be deformed.

In collapsing the conductive overhang into each hole of the dielectric, it is necessary that pressure to the conductive layer is applied through an elastomeric material having a dimpled surface.

The requirement for a dimpled surface in the present invention has been found to lead to improved results compared to use of the elastomeric material with a smooth surface. The elastomeric material applies pressure to the conductive overhang to collapse the overhang into the hole of the dielectric layer to contact or almost contact the opposite conductive layer. At an equal operating pressure, it has been found that the dimpled surface collapsed the overhang satisfactory but a smooth elastomeric surface did not.

Preferably the portions of the elastomeric surface which are not depressed or indented are in a symmetrical pattern to obtain uniformity in collapsing a large number of conductive overhangs. Also preferably the portions of the elastomeric surface which are not depressed or indented are not connected to one another through bridging surface portions which are not depressed or indented. However it is within the scope of the invention that these surface portions are connected to one another provided dimples are present, since, e.g., thin connecting surface poritions which are depressed or indented can be of narrow width.

The portion of the surface of the elastomeric material which is not depressed or indented denerally will be in the range from 10% to 50% and more specifically 15 to 35% (i.e., in comparison to a smooth surface).

The portions of the elastomer which are not depressed or indented will generally have an area not greater than 200% of the area of the hole in the conductive layer. Generally these portions will have an area not less than 50% of the area of the hole in the conductive layer since the elastomer surface which is not depressed or indented (also called posts herein) normally contacts the conductor overhang in application of pressure. The degree of depression or indentation is not critical and generally will be in the range of 0.004 to 0.020 inches in depth.

These surface portions not depressed or indented preferably range from 0.004 to 0.020 inches (0.01–0.051 cm) in diameter and more preferably about 0.004 to 0.012 inches (0.0102–0.02591 cm) in diameter. The minimum number of posts needed is preferably equal to the number of through holes, also known as vias, in the circuit board wherein the posts are approximately in register with the vias. Preferably the elastomeric pad has at least 4,000 posts/sq. inch (620 posts/cm$^2$). The post size depends ultimately on the hole size. Too large a post will not function as efficiently nor will too small a post.

Elastomeric materials having a durometer reading of at least 40 Shore A have been found to be useful in this invention. Preferred are materials having a durometer reading of 40–80 Shore A (Shore A hardness meter manufactured by Shore Instrument and Manufacturing Co., NY, NY). Some materials useful in making the dimpled elastomeric pads are natural and synthetic rubbers such as butadiene rubbers (vulcanized), butadiene/styrene rubbers, butadiene/isoprene rubbers, butyl rubbers, chlorinated rubbers, ethylene propylene diene rubbers, polyisoprene rubbers, urethane and silicone rubbers. Preferably chlorosulfonated polyethylene rubbers are used.

These pads may be made by molding a natural or synthetic rubber having a durometer reading of at least 40 against a mold made from a Dycril ® printing plate of a uniform screen tint.

These dimpled elastomeric pads are preferably restrained by a frame to prevent lateral movement of the pad during compression.

Collapse of the conductive overhang from one or both conductive layers into the through-hole in the dielectric layer allows a pathway for an electric connection between the conductive layers. Generally the deformed overhang will directly touch the other conductive layer although it is possible that only close contact occur since normally an overcoat layer is applied, such as copper, tin or solder, to complete the conductive path. A larger number of through-holes can be formed simultaneously, e.g., fifty or a thousand or more.

The present invention using a dimpled elastomeric surface to apply pressure to the conductive layer in surface deformation has been found to need considerably less pressure to deform the conductor and obtain satisfactory yield. Illustratively deformation of copper foil with a flat elastomeric pad required a pressure of 20,000 psi (1409 kg/cm$^2$) to obtain 100% yields based on conductivity measurements from one conductive surface to another. In contrast use of a dimpled elastomeric pad reduced the pressure to 1,000 psi (70.5 kg/cm) to obtain a corresponding 100% yield.

In the following examples all parts and percentages are by weight unless otherwise indicated.

EXAMPLE 1

The polypropylene cover sheet of a Vacrel ®730 FR film was removed and the tacky photopolymer was laminated to a piece of copper clad glass epoxy laminate. The polyethylene terephthalate sheet was removed and a piece of 1.0 mil (0.0025 cm) copper foil was laminated to the polymer coated copper clad substrate. Small 10 mil (0.025 cm) holes were formed in the copper foil using Riston ®1210 photopolymer film and the process described in U.S. Pat. No. 3,469,982. The sample was immersed in an ultrasonic cleaner filled with methylchloroform for 45 seconds which removed polymer from the holes leaving a copper overhang of about 5 mils (0.0127 cm). The sample was rinsed in water to stop development and heat cured at 150° C. for 16 hours.

After development and curing, the copper/polymer/copper sandwich was placed in a laminating press and covered with a elastomeric pad made from chlorosulfonated polyethylene rubber having a hardness of 63 that had a regular pattern of 4 mil posts (17,000/sq. in.). The press was pressurized to 1000 psi to collapse the copper overhangs onto the lower copper layer. The copper/polymer/copper sandwich was electroplated for 15 minutes at 30 amps/ft$^2$ (2.755 amps/m$^2$) in an acid copper sulfate plating bath.

The top of the plated sandwich was covered with Riston ®1210 photopolymer film and 70 mil (0.1778 cm) pads were etched around the collapsed and plated holes using circuit etching techniques described in U.S. Pat. No. 3,469,982. The vias were electrically conductive.

EXAMPLE 2

A 6"×6" (15.25 cm×15.24 cm) panel of 0.0035 inch (0.011 cm) thick Pyralux ® LF-9110 laminate (copper clad on one side only, manufactured by the Du Pont Company) was laminated polymer side down to double sided copper clad glass epoxy substrate using 0.001 inch (0.0057 cm) thick Pyralux ® WA adhesive in a lamination press at 350 psi (24.659 kg/cm$^2$) and 350° F. (176.7° C.) for 60 minutes. A pattern of 441 U-shaped holes was formed in the copper foil on the upper surface of the LF9110 using Riston ®1210 (Du Pont Co.) and the process described in U.S. Pat. No. 3,469,982.

Each U-shaped hole was 0.009 inches by 0.009 inches (0.023×0.023 cm) except for a copper foil tab 0.006 inches long by 0.003 inches (0.015×0.0076 cm) wide with both of its sides 0.006 inches (0.01524 cm) in length equally spaced 0.003 inches (0.0076 cm) from opposite edges of the holes. The sample was then placed in the chamber of a Branson Plasma Etcher Model 7411. A vacuum was drawn to a base pressure of 50 microns and the gas comprised of 70% O$_2$ and 30% CF$_4$ (by volume) was introduced until the chamber pressure reached 200 microns. The pump rate was 550 CFM and the gas flow was estimated to be 750 cc/min. The RF power was turned onto a setting of 4000 watts and the etching was continued for 70 minutes. The plasma etched through the 0.003 inches (0.0076 cm) of dielectric material where holes were formed in the copper foil. The plasma etched laterally as well as vertically forming copper overhangs. The sample was placed in a laminating press and covered with the rubber pad described in Example 1. The press was pressurized to 4000 psi (281.82 kg/cm$^2$) to collapse the copper overhangs onto the lower copper foil. The sample was electroplated for 54 minutes at 20 amps/sq. ft. (1.86 amps/m$^2$) then the top of the plated sandwich was covered with Riston ®1210 and 70 mil pads were etched around the collapsed and plated holes using circuit techniques described in U.S. Pat. No. 3,469,982. All the vias were electrically conductive.

EXAMPLE 3

A 6"×6" (15.24 cm×15.24 cm) panel of 0.0035 inch (0.011 cm) thick Pyralux ® LF-9110 laminate (copper clad on one side only, manufactured by the Du Pont Company) was laminated polymer side down to a double sided copper clad glass epoxy substrate using 0.001 inch (0.0057 cm) thick Pyralux ® WA adhesive in a lamination press at 350 psi and 350° F. (176.7° C.) for 60 minutes. A pattern of 0.010 inch round holes was formed in the copper foil on the upper surface of the LF-9110 using Riston ®1210 photopolymer resist (Du Pont Co.) and the process described in U.S. Pat. No. 3,469,982.

The sample was then placed in the chamber of a Branson Plasma Etcher Model 7411. A vacuum was drawn to a base pressure of 50 microns and the gas comprised of 70% O$_2$ and 30% CF$_4$ (by volume) was introduced until the chamber pressure reached 200 microns. The pump rate was 550 CFM and the gas flow was estimated to be 750 cc/min. The RF power was turned onto a setting of 4000 watts and the etching was continued for 70 minutes. The plasma etched through the 0.003 inches (0.0076 cm) of dielectric material where holes were formed in the copper foil. The plasma etched laterally as well as vertically forming copper overhangs.

The sample was placed in a manual punch and covered with the rubber pad described in Example 1. The punch was pressurized to about 4000 psi to collapse the copper overhangs onto the lower copper foil. The metal overhangs were collapsed to touch the lower foil as shown by microscopic examination.

A similar sample was placed in the manual punch and covered with a flat elastomeric pad made from the same material as above. The manual punch was pressurized as before and the sample examined using a microscope. The metal overhangs had not been collapsed sufficiently to contact the lower copper foil.

What is claimed is:

1. A process for making multiple electrically conductive paths in a dielectric layer sandwiched between two conductive layers with a series of holes extending through one of the conductive layers and the dielectric layer comprising; providing the holes in the conductive layer and the dielectric layer are of different size with the conductive layer overhanging the holes in the dielectric layer and applying pressure to conductive overhangs by an elastomeric material which contacts the conductive layer and has a dimpled surface.

2. The process of claim 1 wherein 10% to 50% of the surface of the elastomeric material is not depressed or indented.

3. The process of claim 2 wherein 15 to 35% of the surface of the elastomeric material is not depressed or indented.

4. The process of claim 1 wherein substantially each portion of the elastomeric material which is not depressed or indented is not greater than 200% of the area of a hole in the conductive layer.

5. The process of claim 1 wherein substantially each portion of the elastomeric material which is not depressed or indented is not less than 50% of the area of a hole in the conductive layer.

6. The process of claim 1 wherein at least 50 holes are present.

7. The process of claim 1 wherein the holes in the conductive layer are noncircular.

8. The process of claim 1 wherein holes are in both conductive layers opposite one another.

9. The process of claim 1 wherein the conductive overhangs are in the shape of a tab.

* * * * *